United States Patent
Lusky et al.

(10) Patent No.: US 7,317,633 B2
(45) Date of Patent: Jan. 8, 2008

(54) PROTECTION OF NROM DEVICES FROM CHARGE DAMAGE

(75) Inventors: Eli Lusky, Tel Aviv (IL); Ilan Bloom, Haifa (IL); Assaf Shappir, Kiryat Ono (IL); Boaz Eitan, Ra'anana (IL)

(73) Assignee: Saifun Semiconductors Ltd, Netanya (IL)

( * ) Notice: Subject to any disclaimer, the term of this patent is extended or adjusted under 35 U.S.C. 154(b) by 0 days.

(21) Appl. No.: 11/175,801

(22) Filed: Jul. 5, 2005

(65) Prior Publication Data

US 2006/0007612 A1 Jan. 12, 2006

Related U.S. Application Data

(60) Provisional application No. 60/585,088, filed on Jul. 6, 2004.

(51) Int. Cl.
*G11C 16/22* (2006.01)
*H01L 23/62* (2006.01)

(52) U.S. Cl. .............................. 365/185.09; 365/185.2; 365/185.23; 257/357; 257/356; 257/355; 257/324; 438/591; 438/593

(58) Field of Classification Search ........... 365/185.03, 365/185.09, 185.2, 185.23; 257/357, 356, 257/355, 324, 173; 438/261, 591, 593
See application file for complete search history.

(56) References Cited

U.S. PATENT DOCUMENTS

| | | | |
|---|---|---|---|
| 3,881,180 A | 4/1975 | Gosney, Jr. | |
| 3,895,360 A | 7/1975 | Cricchi et al. | |
| 3,952,325 A | 4/1976 | Beale et al. | |
| 4,016,588 A | 4/1977 | Ohya et al. | |
| 4,017,888 A | 4/1977 | Christie et al. | |
| 4,145,703 A | 3/1979 | Blanchard et al. | |
| 4,151,021 A | 4/1979 | McElroy | |
| 4,173,766 A | 11/1979 | Hayes | |

(Continued)

FOREIGN PATENT DOCUMENTS

EP 0 656 628 6/1995

(Continued)

OTHER PUBLICATIONS

U.S. Appl. No. 11/489,327, filed Jul. 18, 2006, Eitan et al.

(Continued)

*Primary Examiner*—Andrew Q. Tran
(74) *Attorney, Agent, or Firm*—Eitan Law Group

(57) ABSTRACT

A method for protecting NROM devices from charge damage during process steps, the method including providing X-decoder structure for word line connections, wherein each word line is connected to a pair of transistors, a PMOS transistor and an NMOS transistor the PMOS transistors sharing a common deep N well and the NMOS transistors connected to a P well, wherein during negative charging, the NMOS transistors shunt leakage current to ground, and during positive charging, the PMOS transistors shunt leakage current to ground, providing an N+ tap connected to the N well and connecting the N+ tap to a positive voltage clamping device, and connecting all the P wells together to a common P+ tap and connecting the P+ tap to a negative voltage clamping device, wherein during process steps, the negative and positive voltage clamping devices direct leakage current to ground.

13 Claims, 5 Drawing Sheets

U.S. PATENT DOCUMENTS

| | | |
|---|---|---|
| 4,173,791 A | 11/1979 | Bell |
| 4,247,861 A | 1/1981 | Hsu et al. |
| 4,257,832 A | 3/1981 | Schwabe et al. |
| 4,281,397 A | 7/1981 | Neal et al. |
| 4,306,353 A | 12/1981 | Jacobs et al. |
| 4,342,102 A | 7/1982 | Puar |
| 4,342,149 A | 8/1982 | Jacobs et al. |
| 4,360,900 A | 11/1982 | Bate |
| 4,373,248 A | 2/1983 | McElroy |
| 4,380,057 A | 4/1983 | Kotecha et al. |
| 4,388,705 A | 6/1983 | Sheppard |
| 4,389,705 A | 6/1983 | Sheppard |
| 4,404,747 A | 9/1983 | Collins |
| 4,435,786 A | 3/1984 | Tickle |
| 4,448,400 A | 5/1984 | Harari |
| 4,471,373 A | 9/1984 | Shimizu et al. |
| 4,494,016 A | 1/1985 | Ransom et al. |
| 4,507,673 A | 3/1985 | Aoyama |
| 4,521,796 A | 6/1985 | Rajkanan et al. |
| 4,527,257 A | 7/1985 | Cricchi |
| 4,586,163 A | 4/1986 | Koike |
| 4,613,956 A | 9/1986 | Paterson et al. |
| 4,630,085 A | 12/1986 | Koyama |
| 4,663,645 A | 5/1987 | Komori et al. |
| 4,665,426 A | 5/1987 | Allen et al. |
| 4,667,217 A | 5/1987 | Janning |
| 4,672,409 A | 6/1987 | Takei et al. |
| 4,725,984 A | 2/1988 | Ip et al. |
| 4,733,105 A | 3/1988 | Shin et al. |
| 4,742,491 A | 5/1988 | Liang et al. |
| 4,758,869 A | 7/1988 | Eitan et al. |
| 4,760,555 A | 7/1988 | Gelsomini et al. |
| 4,761,764 A | 8/1988 | Watanabe |
| 4,769,340 A | 9/1988 | Chang et al. |
| 4,780,424 A | 10/1988 | Holler et al. |
| 4,839,705 A | 6/1989 | Tigelaar et al. |
| 4,847,808 A | 7/1989 | Kobatake |
| 4,857,770 A | 8/1989 | Partovi et al. |
| 4,870,470 A | 9/1989 | Bass, Jr. et al. |
| 4,888,735 A | 12/1989 | Lee et al. |
| 4,916,671 A | 4/1990 | Ichiguchi |
| 4,941,028 A | 7/1990 | Chen et al. |
| 4,961,010 A | 10/1990 | Davis |
| 4,992,391 A | 2/1991 | Wang |
| 5,021,999 A | 6/1991 | Kohda et al. |
| 5,027,321 A | 6/1991 | Park |
| 5,029,063 A | 7/1991 | Lingstaedt et al. |
| 5,042,009 A | 8/1991 | Kazerounian et al. |
| 5,075,245 A | 12/1991 | Woo et al. |
| 5,081,371 A | 1/1992 | Wong |
| 5,086,325 A | 2/1992 | Schumann et al. |
| 5,094,968 A | 3/1992 | Schumann et al. |
| 5,104,819 A | 4/1992 | Freiberger et al. |
| 5,117,389 A | 5/1992 | Yiu |
| 5,120,672 A | 6/1992 | Mitchell et al. |
| 5,142,495 A | 8/1992 | Canepa |
| 5,142,496 A | 8/1992 | Van Buskirk |
| 5,159,570 A | 10/1992 | Mitchell et al. |
| 5,168,334 A | 12/1992 | Mitchell et al. |
| 5,172,338 A | 12/1992 | Mehrotra et al. |
| 5,175,120 A | 12/1992 | Lee |
| 5,204,835 A | 4/1993 | Eitan |
| 5,214,303 A | 5/1993 | Aoki |
| 5,237,213 A | 8/1993 | Tanoi |
| 5,241,497 A | 8/1993 | Komarek |
| 5,260,593 A | 11/1993 | Lee |
| 5,268,861 A | 12/1993 | Hotta |
| 5,276,646 A | 1/1994 | Kim et al. |
| 5,280,420 A | 1/1994 | Rapp |
| 5,289,412 A | 2/1994 | Frary et al. |
| 5,293,563 A | 3/1994 | Ohta |
| 5,295,092 A | 3/1994 | Hotta et al. |
| 5,295,108 A | 3/1994 | Higa |
| 5,305,262 A | 4/1994 | Yoneda |
| 5,311,049 A | 5/1994 | Tsuruta |
| 5,315,541 A | 5/1994 | Harari et al. |
| 5,324,675 A | 6/1994 | Hayabuchi |
| 5,334,555 A | 8/1994 | Sugiyama et al. |
| 5,335,198 A | 8/1994 | Van Buskirk et al. |
| 5,338,954 A | 8/1994 | Shimoji |
| 5,345,425 A | 9/1994 | Shikatani |
| 5,349,221 A | 9/1994 | Shimoji |
| 5,350,710 A | 9/1994 | Hong et al. |
| 5,352,620 A | 10/1994 | Komori et al. |
| 5,357,134 A | 10/1994 | Shimoji |
| 5,359,554 A | 10/1994 | Odake et al. |
| 5,361,343 A | 11/1994 | Kosonocky et al. |
| 5,366,915 A | 11/1994 | Kodama |
| 5,375,094 A | 12/1994 | Naruke |
| 5,381,374 A | 1/1995 | Shiraishi et al. |
| 5,393,701 A | 2/1995 | Ko et al. |
| 5,394,355 A | 2/1995 | Uramoto et al. |
| 5,399,891 A | 3/1995 | Yiu et al. |
| 5,400,286 A | 3/1995 | Chu et al. |
| 5,402,374 A | 3/1995 | Tsuruta et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,567 A | 6/1995 | Chen |
| 5,424,978 A | 6/1995 | Wada et al. |
| 5,426,605 A | 6/1995 | Van Berkel et al. |
| 5,434,825 A | 7/1995 | Harari et al. |
| 5,436,478 A | 7/1995 | Bergemont et al. |
| 5,436,481 A | 7/1995 | Egawa et al. |
| 5,440,505 A | 8/1995 | Fazio et al. |
| 5,450,341 A | 9/1995 | Sawada et al. |
| 5,450,354 A | 9/1995 | Sawada et al. |
| 5,455,793 A | 10/1995 | Amin et al. |
| 5,467,308 A | 11/1995 | Chang et al. |
| 5,477,499 A | 12/1995 | Van Buskirk et al. |
| 5,495,440 A | 2/1996 | Asakura |
| 5,496,753 A | 3/1996 | Sakurai et al. |
| 5,508,968 A | 4/1996 | Collins et al. |
| 5,518,942 A | 5/1996 | Shrivastava |
| 5,521,870 A | 5/1996 | Ishikawa |
| 5,523,251 A | 6/1996 | Hong |
| 5,523,972 A | 6/1996 | Rashid et al. |
| 5,530,803 A | 6/1996 | Chang et al. |
| 5,534,804 A | 7/1996 | Woo |
| 5,537,358 A | 7/1996 | Fong |
| 5,544,116 A | 8/1996 | Chao et al. |
| 5,553,018 A | 9/1996 | Wang et al. |
| 5,553,030 A | 9/1996 | Tedrow et al. |
| 5,557,221 A | 9/1996 | Taguchi et al. |
| 5,557,570 A | 9/1996 | Iwahashi |
| 5,559,687 A | 9/1996 | Nicollini et al. |
| 5,563,823 A | 10/1996 | Yiu et al. |
| 5,566,125 A | 10/1996 | Fazio et al. |
| 5,568,085 A | 10/1996 | Eitan et al. |
| 5,579,199 A | 11/1996 | Kawamura et al. |
| 5,581,252 A | 12/1996 | Thomas |
| 5,583,808 A | 12/1996 | Brahmbhatt |
| 5,590,068 A | 12/1996 | Bergemont |
| 5,590,074 A | 12/1996 | Akaogi et al. |
| 5,592,417 A | 1/1997 | Mirabel |
| 5,596,527 A | 1/1997 | Tomioka et al. |
| 5,599,727 A | 2/1997 | Hakozaki et al. |
| 5,600,586 A | 2/1997 | Lee et al. |
| 5,604,804 A | 2/1997 | Micali |
| 5,606,523 A | 2/1997 | Mirabel |
| 5,608,679 A | 3/1997 | Mi et al. |
| 5,612,642 A | 3/1997 | McClinyock |

| | | | | | | |
|---|---|---|---|---|---|---|
| 5,617,357 | A | 4/1997 | Haddad et al. | RE36,179 | E | 4/1999 | Shimoda |
| 5,623,438 | A | 4/1997 | Guritz et al. | 5,892,710 | A | 4/1999 | Fazio et al. |
| 5,627,790 | A | 5/1997 | Golla et al. | 5,903,031 | A | 5/1999 | Yamada et al. |
| 5,633,603 | A | 5/1997 | Lee | 5,910,924 | A | 6/1999 | Tanaka et al. |
| 5,636,288 | A | 6/1997 | Bonneville et al. | 5,920,503 | A | 7/1999 | Lee et al. |
| 5,644,531 | A | 7/1997 | Kuo et al. | 5,920,507 | A | 7/1999 | Takeuchi et al. |
| 5,654,568 | A | 8/1997 | Nakao | 5,926,409 | A | 7/1999 | Engh et al. |
| 5,656,513 | A | 8/1997 | Wang et al. | 5,930,195 | A | 7/1999 | Komatsu et al. |
| 5,657,332 | A | 8/1997 | Auclair et al. | 5,933,366 | A | 8/1999 | Yoshikawa |
| 5,661,060 | A | 8/1997 | Gill et al. | 5,933,367 | A | 8/1999 | Matsuo et al. |
| 5,663,907 | A | 9/1997 | Frayer et al. | 5,936,888 | A | 8/1999 | Sugawara |
| 5,666,365 | A | 9/1997 | Kostreski | 5,940,332 | A | 8/1999 | Artieri |
| 5,672,959 | A | 9/1997 | Der | 5,946,258 | A | 8/1999 | Evertt et al. |
| 5,675,280 | A | 10/1997 | Nomura | 5,946,558 | A | 8/1999 | Hsu |
| 5,677,867 | A | 10/1997 | Hazani | 5,949,714 | A | 9/1999 | Hemink et al. |
| 5,677,869 | A | 10/1997 | Fazio et al. | 5,949,728 | A | 9/1999 | Liu et al. |
| 5,683,925 | A | 11/1997 | Irani et al. | 5,959,311 | A * | 9/1999 | Shih et al. .................... 257/48 |
| 5,689,459 | A | 11/1997 | Chang et al. | 5,963,412 | A | 10/1999 | En |
| 5,694,356 | A | 12/1997 | Wong et al. | 5,963,465 | A | 10/1999 | Eitan |
| 5,696,929 | A | 12/1997 | Hasbun et al. | 5,966,603 | A | 10/1999 | Eitan |
| 5,708,608 | A | 1/1998 | Park et al. | 5,969,989 | A | 10/1999 | Iwahashi |
| 5,712,814 | A | 1/1998 | Fratin et al. | 5,969,993 | A | 10/1999 | Takeshima |
| 5,712,815 | A | 1/1998 | Bill et al. | 5,973,373 | A | 10/1999 | Krautschneider et al. |
| 5,715,193 | A | 2/1998 | Norman | 5,982,666 | A | 11/1999 | Campardo |
| 5,717,581 | A | 2/1998 | Canclini | 5,986,940 | A | 11/1999 | Atsumi et al. |
| 5,717,632 | A | 2/1998 | Richart et al. | 5,990,526 | A | 11/1999 | Bez et al. |
| 5,717,635 | A | 2/1998 | Akatsu | 5,991,202 | A | 11/1999 | Derhacobian et al. |
| 5,721,781 | A | 2/1998 | Deo et al. | 5,999,444 | A | 12/1999 | Fujiwara et al. |
| 5,726,946 | A | 3/1998 | Yamagata et al. | 5,999,494 | A | 12/1999 | Holzrichter |
| 5,748,534 | A | 5/1998 | Dunlap et al. | 6,000,006 | A | 12/1999 | Bruce et al. |
| 5,751,037 | A | 5/1998 | Aozasa et al. | 6,005,423 | A | 12/1999 | Schultz |
| 5,751,637 | A | 5/1998 | Chen et al. | 6,011,725 | A | 1/2000 | Eitan |
| 5,754,475 | A | 5/1998 | Bill et al. | 6,018,186 | A | 1/2000 | Hsu |
| 5,760,445 | A | 6/1998 | Diaz | 6,020,241 | A | 2/2000 | You et al. |
| 5,760,634 | A | 6/1998 | Fu | 6,028,324 | A | 2/2000 | Su et al. |
| 5,768,192 | A | 6/1998 | Eitan | 6,030,871 | A | 2/2000 | Eitan |
| 5,768,193 | A | 6/1998 | Lee et al. | 6,034,403 | A | 3/2000 | Wu |
| 5,771,197 | A | 6/1998 | Kim | 6,034,896 | A | 3/2000 | Ranaweera et al. |
| 5,774,395 | A | 6/1998 | Richart et al. | 6,037,627 | A | 3/2000 | Kitamura et al. |
| 5,777,919 | A | 7/1998 | Chi-Yung et al. | 6,040,610 | A | 3/2000 | Noguchi et al. |
| 5,781,476 | A | 7/1998 | Seki et al. | 6,044,019 | A | 3/2000 | Cernea et al. |
| 5,781,478 | A | 7/1998 | Takeuchi et al. | 6,044,022 | A | 3/2000 | Nachumovsky |
| 5,783,934 | A | 7/1998 | Tran | 6,063,666 | A | 5/2000 | Chang et al. |
| 5,784,314 | A | 7/1998 | Sali et al. | 6,064,226 | A | 5/2000 | Earl |
| 5,787,036 | A | 7/1998 | Okazawa | 6,064,251 | A | 5/2000 | Park |
| 5,793,079 | A | 8/1998 | Georgescu et al. | 6,064,591 | A | 5/2000 | Takeuchi et al. |
| 5,801,076 | A | 9/1998 | Ghneim et al. | 6,074,916 | A | 6/2000 | Cappelletti |
| 5,805,500 | A | 9/1998 | Campardo et al. | 6,075,402 | A | 6/2000 | Ghilardelli |
| 5,808,506 | A | 9/1998 | Tran | 6,075,724 | A | 6/2000 | Li et al. |
| 5,812,449 | A | 9/1998 | Song | 6,078,518 | A | 6/2000 | Chevallier |
| 5,812,456 | A | 9/1998 | Hull et al. | 6,081,456 | A | 6/2000 | Dadashev |
| 5,812,457 | A | 9/1998 | Arase | 6,084,794 | A | 7/2000 | Lu et al. |
| 5,815,435 | A | 9/1998 | Van Tran | 6,091,640 | A | 7/2000 | Kawahara et al. |
| 5,822,256 | A | 10/1998 | Bauer et al. | 6,094,095 | A | 7/2000 | Murray et al. |
| 5,825,683 | A | 10/1998 | Chang et al. | 6,097,639 | A | 8/2000 | Choi et al. |
| 5,825,686 | A | 10/1998 | Schmitt-Landsiedel et al. | 6,107,862 | A | 8/2000 | Mukainakano et al. |
| 5,828,601 | A | 10/1998 | Hollmer et al. | 6,108,240 | A | 8/2000 | Lavi et al. |
| 5,834,851 | A | 11/1998 | Ikeda et al. | 6,108,241 | A | 8/2000 | Chevallier |
| 5,835,935 | A | 11/1998 | Estakhri et al. | 6,117,714 | A | 9/2000 | Beatty |
| 5,836,772 | A | 11/1998 | Chang et al. | 6,118,207 | A | 9/2000 | Ormerod et al. |
| 5,841,700 | A | 11/1998 | Chang | 6,118,692 | A | 9/2000 | Banks |
| 5,847,441 | A | 12/1998 | Cutter et al. | 6,122,198 | A | 9/2000 | Haddad et al. |
| 5,861,771 | A | 1/1999 | Matsuda et al. | 6,128,226 | A | 10/2000 | Eitan et al. |
| 5,862,076 | A | 1/1999 | Eitan | 6,128,227 | A | 10/2000 | Kim |
| 5,864,164 | A | 1/1999 | Wen | 6,130,572 | A | 10/2000 | Ghilardelli et al. |
| 5,867,429 | A | 2/1999 | Chen et al. | 6,130,574 | A | 10/2000 | Bloch et al. |
| 5,870,334 | A | 2/1999 | Hemink et al. | 6,133,095 | A | 10/2000 | Eitan et al. |
| 5,870,335 | A | 2/1999 | Khan et al. | 6,134,156 | A | 10/2000 | Eitan |
| 5,872,848 | A | 2/1999 | Romney et al. | 6,137,718 | A | 10/2000 | Reisinger |
| 5,875,128 | A | 2/1999 | Ishizuka et al. | 6,147,904 | A | 11/2000 | Liron |
| 5,877,537 | A | 3/1999 | Aoki | 6,147,906 | A | 11/2000 | Bill et al. |
| 5,880,620 | A | 3/1999 | Gitlin et al. | 6,150,800 | A | 11/2000 | Kinoshita et al. |
| 5,886,927 | A | 3/1999 | Takeuchi | 6,154,081 | A | 11/2000 | Pakkala et al. |

| | | | | | | |
|---|---|---|---|---|---|---|
| 6,156,149 | A | 12/2000 | Cheung et al. | 6,353,356 | B1 | 3/2002 | Liu |
| 6,157,242 | A | 12/2000 | Fukui | 6,353,554 | B1 | 3/2002 | Banks |
| 6,157,570 | A | 12/2000 | Nachumovsky | 6,353,555 | B1 | 3/2002 | Jeong |
| 6,163,048 | A | 12/2000 | Hirose et al. | 6,356,062 | B1 | 3/2002 | Elmhurst et al. |
| 6,163,484 | A | 12/2000 | Uekubo | 6,356,469 | B1 | 3/2002 | Roohparvar et al. |
| 6,169,691 | B1 | 1/2001 | Pasotti et al. | 6,359,501 | B2 | 3/2002 | Lin et al. |
| 6,175,523 | B1 | 1/2001 | Yang et al. | 6,374,337 | B1 | 4/2002 | Estakhri |
| 6,181,597 | B1 | 1/2001 | Nachumovsky | 6,385,086 | B1 | 5/2002 | Mihara et al. |
| 6,181,605 | B1 | 1/2001 | Hollmer et al. | 6,396,741 | B1 | 5/2002 | Bloom et al. |
| 6,185,143 | B1 | 2/2001 | Perner et al. | 6,400,209 | B1 | 6/2002 | Matsuyama et al. |
| 6,188,211 | B1 | 2/2001 | Rincon-Mora et al. | 6,400,607 | B1 | 6/2002 | Pasotti et al. |
| 6,190,966 | B1 | 2/2001 | Ngo et al. | 6,407,537 | B2 | 6/2002 | Antheunis |
| 6,192,445 | B1 | 2/2001 | Rezvani | 6,410,388 | B1 | 6/2002 | Kluth et al. |
| 6,195,196 | B1 | 2/2001 | Kimura et al. | 6,417,081 | B1 | 7/2002 | Thurgate |
| 6,198,342 | B1 | 3/2001 | Kawai | 6,418,506 | B1 | 7/2002 | Pashley et al. |
| 6,201,282 | B1 | 3/2001 | Eitan | 6,426,898 | B1 | 7/2002 | Mihnea et al. |
| 6,201,737 | B1 | 3/2001 | Hollmer et al. | 6,429,063 | B1 | 8/2002 | Eitan |
| 6,205,055 | B1 | 3/2001 | Parker | 6,433,624 | B1 | 8/2002 | Grossnikle et al. |
| 6,205,056 | B1 | 3/2001 | Pan et al. | 6,436,766 | B1 | 8/2002 | Rangarajan et al. |
| 6,205,059 | B1 | 3/2001 | Gutala et al. | 6,436,768 | B1 | 8/2002 | Yang et al. |
| 6,208,200 | B1 | 3/2001 | Arakawa | 6,438,031 | B1 | 8/2002 | Fastow |
| 6,208,557 | B1 | 3/2001 | Bergemont et al. | 6,438,035 | B2 | 8/2002 | Yamamoto et al. |
| 6,214,666 | B1 | 4/2001 | Mehta | 6,440,797 | B1 | 8/2002 | Wu et al. |
| 6,215,148 | B1 | 4/2001 | Eitan | 6,442,074 | B1 | 8/2002 | Hamilton et al. |
| 6,215,697 | B1 | 4/2001 | Lu et al. | 6,445,030 | B1 | 9/2002 | Wu et al. |
| 6,215,702 | B1 | 4/2001 | Derhacobian et al. | 6,449,188 | B1 | 9/2002 | Fastow |
| 6,218,695 | B1 | 4/2001 | Nachumovsky | 6,449,190 | B1 | 9/2002 | Bill |
| 6,219,277 | B1 | 4/2001 | Devin et al. | 6,452,438 | B1 | 9/2002 | Li |
| 6,219,290 | B1 | 4/2001 | Chang et al. | 6,455,896 | B1 * | 9/2002 | Chou et al. ................. 257/355 |
| 6,222,762 | B1 | 4/2001 | Guterman et al. | 6,456,528 | B1 | 9/2002 | Chen |
| 6,222,768 | B1 | 4/2001 | Hollmer et al. | 6,456,533 | B1 | 9/2002 | Hamilton et al. |
| 6,233,180 | B1 | 5/2001 | Eitan et al. | 6,458,656 | B1 | 10/2002 | Park et al. |
| 6,240,032 | B1 | 5/2001 | Fukumoto | 6,458,677 | B1 | 10/2002 | Hopper et al. |
| 6,240,040 | B1 | 5/2001 | Akaogi et al. | 6,469,929 | B1 | 10/2002 | Kushnarenko et al. |
| 6,246,555 | B1 | 6/2001 | Tham | 6,469,935 | B2 | 10/2002 | Hayashi |
| 6,252,442 | B1 | 6/2001 | Malherbe | 6,472,706 | B2 | 10/2002 | Widdershoven et al. |
| 6,252,799 | B1 | 6/2001 | Liu et al. | 6,477,085 | B1 | 11/2002 | Kuo |
| 6,256,231 | B1 | 7/2001 | Lavi et al. | 6,490,204 | B2 | 12/2002 | Bloom et al. |
| 6,261,904 | B1 | 7/2001 | Pham et al. | 6,496,414 | B2 | 12/2002 | Kasa et al. |
| 6,265,268 | B1 | 7/2001 | Halliyal et al. | 6,504,756 | B2 | 1/2003 | Gonzalez et al. |
| 6,266,281 | B1 | 7/2001 | Derhacobian et al. | 6,510,082 | B1 | 1/2003 | Le et al. |
| 6,272,047 | B1 | 8/2001 | Mihnea et al. | 6,512,701 | B1 | 1/2003 | Hamilton et al. |
| 6,275,414 | B1 | 8/2001 | Randolph et al. | 6,519,180 | B2 | 2/2003 | Tran et al. |
| 6,281,545 | B1 | 8/2001 | Liang et al. | 6,519,182 | B1 | 2/2003 | Derhacobian et al. |
| 6,282,133 | B1 | 8/2001 | Nakagawa et al. | 6,522,585 | B2 | 2/2003 | Pasternak |
| 6,282,145 | B1 | 8/2001 | Tran et al. | 6,525,969 | B1 | 2/2003 | Kurihara et al. |
| 6,285,246 | B1 | 9/2001 | Basu | 6,528,390 | B2 | 3/2003 | Komori et al. |
| 6,285,574 | B1 | 9/2001 | Eitan | 6,529,412 | B1 | 3/2003 | Chen et al. |
| 6,285,589 | B1 | 9/2001 | Kajitani | 6,532,173 | B2 | 3/2003 | Lioka et al. |
| 6,285,614 | B1 | 9/2001 | Mulatti et al. | 6,535,020 | B1 | 3/2003 | Yin |
| 6,292,394 | B1 | 9/2001 | Cohen et al. | 6,535,434 | B2 | 3/2003 | Maayan et al. |
| 6,297,096 | B1 | 10/2001 | Boaz | 6,537,881 | B1 | 3/2003 | Rangarjan et al. |
| 6,297,143 | B1 | 10/2001 | Foote et al. | 6,538,270 | B1 | 3/2003 | Randolph et al. |
| 6,297,974 | B1 | 10/2001 | Ganesan et al. | 6,541,816 | B2 | 4/2003 | Ramsbey et al. |
| 6,304,485 | B1 | 10/2001 | Harari et al. | 6,552,387 | B1 | 4/2003 | Eitan |
| 6,307,784 | B1 | 10/2001 | Hamilton et al. | 6,555,436 | B2 | 4/2003 | Ramsbey et al. |
| 6,307,807 | B1 | 10/2001 | Sakui et al. | 6,559,500 | B2 | 5/2003 | Torii |
| 6,308,485 | B1 | 10/2001 | Blumenthal | 6,562,683 | B1 | 5/2003 | Wang et al. |
| 6,320,786 | B1 | 11/2001 | Chang et al. | 6,566,194 | B1 | 5/2003 | Ramsbey et al. |
| 6,324,094 | B1 | 11/2001 | Chevallier | 6,566,699 | B2 | 5/2003 | Eitan |
| 6,326,265 | B1 | 12/2001 | Liu et al. | 6,567,303 | B1 | 5/2003 | Hamilton et al. |
| 6,330,192 | B1 | 12/2001 | Ohba et al. | 6,567,312 | B1 | 5/2003 | Torii et al. |
| 6,331,950 | B1 | 12/2001 | Kuo et al. | 6,570,211 | B1 | 5/2003 | He et al. |
| 6,335,874 | B1 | 1/2002 | Eitan | 6,574,139 | B2 | 6/2003 | Kurihara |
| 6,335,990 | B1 | 1/2002 | Chen et al. | 6,577,514 | B2 | 6/2003 | Shor et al. |
| 6,337,502 | B1 * | 1/2002 | Eitan et al. ................. 257/357 | 6,577,532 | B1 | 6/2003 | Chevallier |
| 6,339,556 | B1 | 1/2002 | Watanabe | 6,577,547 | B2 | 6/2003 | Ukon |
| 6,343,033 | B1 | 1/2002 | Parker | 6,583,005 | B2 | 6/2003 | Hashimoto et al. |
| 6,344,959 | B1 | 2/2002 | Milazzo | 6,583,479 | B1 | 6/2003 | Fastow et al. |
| 6,346,442 | B1 | 2/2002 | Aloni et al. | 6,584,017 | B2 | 6/2003 | Maayan et al. |
| 6,348,381 | B1 | 2/2002 | Jong | 6,590,811 | B1 | 7/2003 | Hamilton et al. |
| 6,348,711 | B1 | 2/2002 | Eitan | 6,593,606 | B1 | 7/2003 | Randolph et al. |
| 6,351,415 | B1 | 2/2002 | Kushnarenko | 6,594,181 | B1 | 7/2003 | Yamada |

| | | | | | | |
|---|---|---|---|---|---|---|
| 6,608,526 | B1 | 8/2003 | Sauer | 7,079,420 | B2 | 7/2006 | Shappir et al.
| 6,604,905 | B1 | 8/2003 | Muza et al. | 2001/0006477 | A1 | 7/2001 | Banks
| 6,614,052 | B1 | 9/2003 | Zhang | 2002/0004878 | A1 | 1/2002 | Norman
| 6,614,295 | B2 | 9/2003 | Tsuchi | 2002/0004921 | A1 | 1/2002 | Muranaka et al.
| 6,614,686 | B1 | 9/2003 | Kawamura | 2002/0064911 | A1 | 5/2002 | Eitan
| 6,614,692 | B2 | 9/2003 | Maayan et al. | 2002/0132436 | A1 | 9/2002 | Eliyahu et al.
| 6,617,179 | B1 | 9/2003 | Kim | 2002/0140109 | A1 | 10/2002 | Keshavarzi et al.
| 6,617,215 | B1 | 9/2003 | Halliyal et al. | 2002/0145465 | A1 | 10/2002 | Shor et al.
| 6,618,290 | B1 | 9/2003 | Wang et al. | 2002/0191465 | A1 | 12/2002 | Maayan et al.
| 6,624,672 | B2 | 9/2003 | Confaloneri et al. | 2002/0199065 | A1 | 12/2002 | Subramoney et al.
| 6,627,555 | B2 * | 9/2003 | Eitan et al. ............... 438/710 | 2003/0001213 | A1 | 1/2003 | Lai
| 6,630,384 | B1 | 10/2003 | Sun et al. | 2003/0021155 | A1 | 1/2003 | Yachareni et al.
| 6,633,496 | B2 | 10/2003 | Maayan et al. | 2003/0072192 | A1 | 4/2003 | Bloom et al.
| 6,633,499 | B1 | 10/2003 | Eitan et al. | 2003/0076710 | A1 | 4/2003 | Sofer et al.
| 6,633,956 | B1 | 10/2003 | Mitani | 2003/0117841 | A1 | 6/2003 | Yamashita
| 6,636,440 | B2 | 10/2003 | Maayan et al. | 2003/0131186 | A1 | 7/2003 | Buhr
| 6,639,271 | B1 | 10/2003 | Zheng et al. | 2003/0134476 | A1 | 7/2003 | Roizin et al.
| 6,639,837 | B2 | 10/2003 | Takano et al. | 2003/0142544 | A1 | 7/2003 | Maayan et al.
| 6,639,844 | B1 | 10/2003 | Liu et al. | 2003/0145176 | A1 | 7/2003 | Dvir et al.
| 6,639,849 | B2 | 10/2003 | Takahashi et al. | 2003/0145188 | A1 | 7/2003 | Cohen et al.
| 6,642,148 | B1 | 11/2003 | Ghandehari et al. | 2003/0155659 | A1 | 8/2003 | Verma et al.
| 6,642,573 | B1 | 11/2003 | Halliyal et al. | 2003/0190786 | A1 | 10/2003 | Ramsbey et al.
| 6,642,586 | B2 | 11/2003 | Takahashi | 2003/0197221 | A1 | 10/2003 | Shinozaki et al.
| 6,643,170 | B2 | 11/2003 | Huang et al. | 2003/0202411 | A1 | 10/2003 | Yamada
| 6,643,177 | B1 | 11/2003 | Le et al. | 2003/0206435 | A1 | 11/2003 | Takahashi
| 6,643,178 | B2 | 11/2003 | Kurihara | 2003/0208663 | A1 | 11/2003 | Van Buskirk et al.
| 6,643,181 | B2 | 11/2003 | Sofer et al. | 2003/0209767 | A1 | 11/2003 | Takahashi et al.
| 6,645,801 | B1 | 11/2003 | Ramsbey et al. | 2003/0214844 | A1 | 11/2003 | Iijima
| 6,649,972 | B2 | 11/2003 | Eitan | 2003/0218207 | A1 | 11/2003 | Hashimoto et al.
| 6,650,568 | B2 | 11/2003 | Iijima | 2003/0218913 | A1 | 11/2003 | Le et al.
| 6,653,190 | B1 | 11/2003 | Yang et al. | 2003/0222303 | A1 | 12/2003 | Fukuda et al.
| 6,653,191 | B1 | 11/2003 | Yang et al. | 2003/0227796 | A1 | 12/2003 | Miki et al.
| 6,654,296 | B2 | 11/2003 | Jang et al. | 2004/0007730 | A1 | 1/2004 | Chou et al. ................ 257/314
| 6,664,588 | B2 | 12/2003 | Eitan | 2004/0012993 | A1 | 1/2004 | Kurihara
| 6,665,769 | B2 | 12/2003 | Cohen et al. | 2004/0013000 | A1 | 1/2004 | Torii
| 6,670,241 | B1 | 12/2003 | Kamal et al. | 2004/0014280 | A1 | 1/2004 | Willer et al.
| 6,670,669 | B1 | 12/2003 | Kawamura | 2004/0014290 | A1 | 1/2004 | Yang et al.
| 6,674,138 | B1 | 1/2004 | Halliyal et al. | 2004/0021172 | A1 | 2/2004 | Zheng et al.
| 6,677,805 | B2 | 1/2004 | Shor et al. | 2004/0027858 | A1 | 2/2004 | Takahashi et al.
| 6,680,509 | B1 | 1/2004 | Wu et al. | 2004/0151034 | A1 | 8/2004 | Shor et al.
| 6,686,242 | B2 | 2/2004 | Willer et al. | 2004/0153621 | A1 | 8/2004 | Polansky et al.
| 6,690,602 | B1 | 2/2004 | Le et al. | 2004/0157393 | A1 | 8/2004 | Hwang
| 6,693,483 | B2 | 2/2004 | Deml et al. | 2004/0222437 | A1 | 11/2004 | Avni et al.
| 6,700,818 | B2 | 3/2004 | Shappir et al. | 2005/0117395 | A1 | 6/2005 | Maayan et al.
| 6,717,207 | B2 | 4/2004 | Kato | 2005/0117601 | A1 | 6/2005 | Anderson et al.
| 6,723,518 | B2 | 4/2004 | Papsidero et al. | 2005/0140405 | A1 | 6/2005 | Do et al.
| 6,731,542 | B1 | 5/2004 | Le et al. | 2005/0213593 | A1 | 9/2005 | Anderson et al.
| 6,738,289 | B2 | 5/2004 | Gongwer et al. | 2005/0232024 | A1 | 10/2005 | Atir et al.
| 6,744,692 | B2 | 6/2004 | Shiota et al. | 2006/0084219 | A1 | 4/2006 | Lusky et al.
| 6,765,259 | B2 | 7/2004 | Kim | 2006/0126382 | A1 | 6/2006 | Maayan et al.
| 6,768,165 | B1 | 7/2004 | Eitan | 2006/0126983 | A1 | 6/2006 | Shappir et al.
| 6,781,876 | B2 | 8/2004 | Forbes et al. | | | | |
| 6,788,579 | B2 | 9/2004 | Gregori et al. | | | | |
| 6,791,396 | B2 | 9/2004 | Shor et al. | | | | |
| 6,794,249 | B2 | 9/2004 | Palm et al. | | | | |
| 6,794,280 | B2 | 9/2004 | Chang | | | | |
| 6,818,956 | B2 * | 11/2004 | Kuo et al. ................ 257/357 | | | | |
| 6,829,172 | B2 | 12/2004 | Bloom et al. | | | | |
| 6,831,872 | B2 | 12/2004 | Matsuoka | | | | |
| 6,836,431 | B2 | 12/2004 | Chang | | | | |
| 6,859,028 | B2 | 2/2005 | Toner | | | | |
| 6,869,844 | B1 | 3/2005 | Liu et al. ................ 438/264 | | | | |
| 6,870,772 | B1 | 3/2005 | Nitta et al. | | | | |
| 6,871,258 | B2 | 3/2005 | Micheloni et al. | | | | |
| 6,885,585 | B2 | 4/2005 | Maayan et al. | | | | |
| 6,885,590 | B1 | 4/2005 | Zheng et al. | | | | |
| 6,906,357 | B1 * | 6/2005 | Vashchenko et al. ...... 257/173 | | | | |
| 6,912,160 | B2 | 6/2005 | Yamada | | | | |
| 6,917,544 | B2 | 7/2005 | Maayan et al. | | | | |
| 6,928,001 | B2 | 8/2005 | Avni et al. | | | | |
| 6,937,523 | B2 | 8/2005 | Eshel | | | | |
| 6,967,872 | B2 | 11/2005 | Quader et al. | | | | |
| 6,996,692 | B2 | 2/2006 | Kuono | | | | |

FOREIGN PATENT DOCUMENTS

| | | |
|---|---|---|
| EP | 0751560 | 6/1995 |
| EP | 0693781 | 1/1996 |
| EP | 0 822 557 | 2/1998 |
| EP | 0 843 398 | 5/1998 |
| EP | 0580467 | 9/1998 |
| EP | 0461764 | 7/2000 |
| EP | 1 071 096 | 1/2001 |
| EP | 1073120 | 1/2001 |
| EP | 1 091 418 | 4/2001 |
| EP | 1126468 | 8/2001 |
| EP | 0740307 | 12/2001 |
| EP | 1164597 | 12/2001 |
| EP | 1 207 552 | 5/2002 |
| EP | 1 223 586 | 7/2002 |
| EP | 1 365 452 | 11/2003 |
| EP | 001217744 | 3/2004 |
| GB | 1297899 | 11/1972 |
| GB | 2157489 | 3/1985 |
| JP | 54-053929 | 4/1979 |

| | | |
|---|---|---|
| JP | 60-200566 | 10/1985 |
| JP | 60201594 | 10/1985 |
| JP | 63-249375 | 10/1988 |
| JP | 3-285358 | 12/1991 |
| JP | 04-226071 | 8/1992 |
| JP | 04-291962 | 10/1992 |
| JP | 05021758 | 1/1993 |
| JP | 05-326893 | 12/1993 |
| JP | 06151833 | 5/1994 |
| JP | 06-232416 | 8/1994 |
| JP | 07193151 | 7/1995 |
| JP | 08-106791 | 4/1996 |
| JP | 08-297988 | 11/1996 |
| JP | 09-017981 | 1/1997 |
| JP | 09162314 | 6/1997 |
| JP | 10-106276 | 4/1998 |
| JP | 10 334676 | 12/1998 |
| JP | 11-162182 | 6/1999 |
| JP | 11-354758 | 12/1999 |
| JP | 2001-085646 | 3/2001 |
| JP | 2001-118392 | 4/2001 |
| JP | 2001-156189 | 6/2001 |
| JP | 2002-216488 | 8/2002 |
| JP | 3358663 | 10/2002 |
| WO | WO 81/00790 | 3/1981 |
| WO | WO 96/15553 | 5/1996 |
| WO | WO 96/25741 | 8/1996 |
| WO | WO 98/03977 | 1/1998 |
| WO | WO 99/31670 | 6/1999 |
| WO | WO 99/57728 | 11/1999 |
| WO | WO 00/46808 | 8/2000 |
| WO | WO 01/65566 | 9/2001 |
| WO | WO 01/65567 | 9/2001 |
| WO | WO 01/84552 | 11/2001 |
| WO | WO 02/43073 | 5/2002 |
| WO | WO 03/032393 | 4/2003 |
| WO | WO 03/036651 | 5/2003 |
| WO | WO 03/054964 | 7/2003 |
| WO | WO 03/063167 | 7/2003 |
| WO | WO 03/063168 | 7/2003 |
| WO | WO 03/079370 | 9/2003 |
| WO | WO 03/079446 | 9/2003 |
| WO | WO 03/083916 | 10/2003 |
| WO | WO 03/088258 | 10/2003 |
| WO | WO 03/088259 | 10/2003 |
| WO | WO 03/088260 | 10/2003 |
| WO | WO 03/088261 | 10/2003 |
| WO | WO 03/088353 | 10/2003 |
| WO | WO 03/100790 | 12/2003 |

OTHER PUBLICATIONS

U.S. Appl. No. 11/440,624, filed May 24, 2006, Lusky et al.
Bude et al., EEPROM/Flash Sub 3.0V drain—Source Bias Hot Carrier Writing, IEDM, 1995, pp. 989-992.
Bude et al., Secondary Electron Flash—a High Performance, Low Power Flash Technology for 0.35 um and below, IEDM, 1997, 279-282.
Bude et al., Modeling Nonequilibrium Hot Carrier Device Effects, Conference of Insulator Specialists of Europe, Jun. 1997, Sweden.
Jung et al., IEEE Journal of Solid-State Circuits, Nov. 1996, 1575-1583, vol. 31, No. 11.
Campardo et al., IEE Journal of Solid-State Circuits, Nov. 2000, 1655-1667, vol. 35, No. 11.
Lin et al., Novel Source-Controlled Self-Verified Programming for Multilevel EEPROM's, IEEE Transactions on Electron Devices, Jun. 2000, 1166-1174, vol. 47, No. 6.
Chan et al., A True Single-Transistor Oxide-Nitride-Oxide EEPROM Device, IEEE Electron Device Letters, Mar. 1987, vol. EDL-8, No. 3.
Eitan et al., "Hot-Electron Injection into the Oxide in n-Channel MOS Devices", IEEE Transactions on Electron Devices, vol. ED-28, No. 3, pp. 328-370, Mar. 1981.
Roy Anirban, "Characterization and Modeling of Charge Trapping and Retention in Novel Multi-Dielectric Nonvolatile Semiconductor Memory Devices", Microelectronics Laboratory, Sherman Fairchild Center, Department of Computer Science and Electrical Engineering, Bethlehem, Pennsylvania, p. 1-35, 1989.
Tanaka et al., "A Quick Intelligent Page-Programming Architecture and a Shielded Bitline Sensing Method for 3 V-Only NAND Flash Memory", IEEE Journal of Solid-State Circuits, vol. 29, No. 11, Nov. 1994, pp. 1366-1373.
Ma et al., A Dual-bit Split-Gate EEPROM (DSG) Cell in Contactless Array for Single-Vcc High Density Flash Memories, IEEE, 1994, 57-60.
Oshima et al., Process and Device Technologies for 16Mbit EPROMs with Large-Tilt-Angle Implanted P-Pocket Cell, IEEE, Dec. 1990, Ch. 2865-4/90/0000-0095, pp. 5 2 1-5 2 4, San Francisco, California.
Lee, A new approach for the floating-gate MOS nonvolatile memory, Applied Physics Letters, Oct. 1977, 475-476, vol. 31, No. 7, American Institute of Physics.
Glasser et al., MOS Device Electronics, The Design and Analysis of VLSI Circuits, Chapter 2, 67-163, 1998, Addison Wesley Publishing Company.
Bhattacharyya et al., FET Gate Structure for Nonvolatile N-Channel Read-Mostly Memory Device, IBM Technical Disclosure Bulletin, Nov. 1975, 1768, vol. 18, No. 6.
Ricco et al., Nonvolatile Multilevel Memories for Digital Applications, Dec. 1998, 2399-2421, vol. 86, No. 12, Institute of Electrical and Electronics Engineers, Inc.
Martin, Improved Circuits for the Realization of Switched-Capacitor Filters, IEEE Transactions on Circuits and Systems, Apr. 1980, 237-244, vol. CAS-27.
Tseng et al., "Thin CVD Stacked Gate Dielectric for ULSI Technology", IEEE, pp. 321-214; 1993, 13.1.1-13.1.4.
Pickar, Ion Implementation is Silicon—Physics, Processing, and Microelectronic Devices, Applied Solid State Science, 1975, 151-241, vol. 5, Academic Press.
2 Bit/Cell EEPROM Cell Using Band-To-Band Tunneling for Data Read-Out, IBM Technical Disclosure Bulletin, 1992, 136-140, vol. 35 No. 4B.
Umezawa, et al., A 5-V-Only Operation 0.6-μm Flash EEPROM with Row Decoder Scheme in Triple-Well Structure, IEEE Journal of Solid-State Circuits, 1992, 1540, vol. 27.
Mitchell, et al., A new self-aligned planar array cell for ultra high density EPROMS, 1987.
Esquivel, et al , High Density Contactless, Self Aligned EPROM Cell Array Technology, 1986.
Johns, Martin, Analog Integrated Circuit Designl, Jun. 1, 1997, Chapter 10, John Wiley and Sons, Inc.
Allen, et al., CMOS Analog Circuit Design, 2002, 259pages, Oxford University Press.
Klinke, et al., A very-high-slew-rate CMOS operational amplifier, IEEE Journal of Solid-State Circuits, 1989, 744-746, 24 vol.
Shor, et al, paper WA2.04.01—Self regulated Four phased charge pump with boosted wells, ISCAS 2002.
Fotouhi, An efficient CMOS line driver for 1.544-Mb/s T1 and 2.048-Mb/s E1 applications, IEEE Journal of Solid-State Circuits, 2003, 226-236pages, 38vol.
P-N Junction Diode, Physics of semiconductor devices, 1981, ch. 2, "A Wiley-Interscience Publication", John Wiley & Sons Publishers.
Chang, Non Volatile Semiconductor Memory Devices, Proceedings of the IEEE, 64 vol., No. 7, pp. 1039-1059; Jul. 1976.
Yoon, Sukyoon, et al., A Novel Substrate Hot Electron and Hole Injection Structure with a double-implanted buried-channel MOSFET, IEEE Transactions on Electron Devices, Dec. 1991, p. 2722, vol. 38, No. 12.
4 Bits of Digital Data Fit in a Single Cell, Technology Newsletter, Electronics Design, Apr. 1, 1996.
M. Specht et al, Novel Dual Bit Tri- Gate Charge Trapping Memory Devices, IEEE Electron Device Letters, vol. 25, No. 12, Dec. 2004, pp. 810-812.

"Design Considerations in Scaled SONOS Nonvolatile Memory Devices" Bu, Jiankang et al., Lehigh University, Bethlehem, PA, Power Point Presentation, pp. 1-24, 2000; http://klabs.org/richcontent/MemoryContent/nvmt_symp/nvmts_2000/presentations/bu_white_sonos_lehigh_univ.pdf.

"SONOS Nonvolatile Semiconductor Memories for Space and Military Applications", Adams et al., Symposium, 2000. http://klabs.org/richcontent/MemoryContent/nvmt_symp/nvmts_2000/papers/adams_d.pdf.

"Philips Research—Technologies—Embedded Nonvolatile Memories" http://research.philips.com/technologies/ics/nvmemories/index.html.

"Semiconductor Memory: Non-Volatile Memory (NVM)", National Universiry of Singapore, Department of Electrical and Computer Engineering: http://ece.nus.edu.sg/stfpage/elezhucx/myweb/NVM.pdf.

* cited by examiner

PROTECTION OF NROM DEVICES FROM CHARGE DAMAGE

RELATED APPLICATIONS

This application asserts priority of provisional application Ser. No. 60/585,088 filed Jul. 6, 2004.

FIELD OF THE INVENTION

The present invention relates to NROM devices, and more particularly to protecting such devices against induced charge damage during fabrication.

BACKGROUND OF THE INVENTION

Non-volatile memory (NVM) cells generally comprise transistors with programmable threshold voltages. For example, a floating gate transistor or a split gate transistor has a threshold voltage (Vt) that is programmed or erased by charging or discharging a floating gate located between a control gate and a channel in the transistor. Data is written in such memory cells by charging or discharging the floating gates of the memory cells to achieve threshold voltages corresponding to the data.

The act of programming the cell involves charging the floating gate with electrons, which increases the threshold voltage Vt. The act of erasing the cell involves removing electrons from the floating gate, which decreases the threshold voltage Vt.

One type of non-volatile cell is a nitride, read only memory (NROM) cell. Unlike a floating gate cell, the NROM cell has two separated and separately chargeable areas. Each chargeable area may define one bit or more. The separately chargeable areas are found within a nitride layer formed in an oxide-nitride-oxide (ONO) stack underneath the gate. When programming a bit, channel hot electrons are injected into the nitride layer. This is generally accomplished by the application of a positive gate voltage and positive drain voltage, the magnitude and duration of which are determined by different factors related to the amount of programming required.

However, during device fabrication, unintentional tunneling currents may be induced, resulting with cells charging, higher Vt and larger Vt variations between cells across the wafer. Such conditions may adversely impact device production.

After a stacked gate is formed, additional processing steps are performed to finish fabrication. For example, additional masking and etching may be required to form additional semiconductor structures or to deposit metal or polysilicon interconnections on a semiconductor device. When a device is exposed to plasma processing, e.g., plasma etching, electrical charges may accumulate on the interconnections due to a phenomenon referred to as the "antenna effect". The accumulated charge on the interconnections creates a voltage difference across the ONO layer of a NROM memory cell. A sufficiently large voltage difference may cause tunneling current to flow through the ONO layer introducing a programming effect and altering the threshold voltage of the memory cell.

Methods have been described in the prior art for protecting memory cells from charging induced during device fabrication by limiting the accumulation of charge on device interconnections during fabrication and by dissipating any accumulated charge in a safe manner. For example, U.S. Pat. No. 6,869,844 to Liu, et al., assigned to Advanced Micro Device, Inc., describes a protective semiconductor structure for limiting and dissipating accumulated charge from the conductive interconnections in an NROM memory array. Protective structures are connected to the device interconnections to provide a discharge path for the accumulated charge without adversely affecting the normal operation of the semiconductor device. The discharge path is provided by a thin insulating layer between a conductive interconnection and the device substrate. The thin insulating layer is formed over a p-well formed in an n-well in the semiconductor substrate. The interconnection to be protected is formed so that a portion of the interconnection overlies the thin insulating layer. The structure forms a capacitor and back-to-back diodes connected in series between the protected interconnection and the substrate, providing a discharge path for built up charge on the interconnection.

Another example is U.S. patent application Ser. No. 20040007730 to Chou et al., assigned to Macronix of Taiwan, which describes a protection device for protecting against plasma and other related charge damages. The protection device basically includes back-to-back diodes and protection circuitry per word line. The protection device may be understood by referring to FIGS. 1 and 2. (FIG. 1 corresponds to FIG. 5 of U.S. patent application Ser. No. 20040007730.)

Reference is first made to FIG. 1. The structure of the protection device includes a semiconductor substrate 20 (PW) having an intrinsic p-type doping. A first deep n-type well 21 (NWD) and a second deep n-type well 22 (NWD) are formed by diffusion of n-type dopants into the substrate 20. A PMOS transistor 12 has a p-type source 23 and a p-type drain 24 formed within the first deep n-type well 21. An. n-type contact 25 is formed on the surface of the first deep n-type well 21. The p-type contact region 26 is formed in the surface of the substrate 20 (PW), preferably adjacent to the first deep n-type well 21. A gate 27 is formed over an insulator (not shown) between the source 23 and the drain 24 over the channel region. The first deep n-type well 21 acts as the semiconductor bulk within which the channel region is formed. The gate 27 is coupled to the first deep n-type well 21 via the contact 25. The source 23 is coupled to the substrate 20 via the contact 26, and to a ground reference. The drain 24 is coupled via a conductive line to a node 30 to be protected in integrated circuitry on the device. The gate 27 is also coupled to a circuit on the device which supplies the highest voltage VPCP11 available during operation. The voltage on the gate 27 is at least as high as the highest operating voltage applied to the node 30 during operation, and is high enough to bias the PMOS transistor 12 in a normally off position during operation of the device. During manufacture, node 30 is left floating.

Within the second deep n-type well 22, a deep p-type well 31 (PAW) is formed. An NMOS transistor 14 (also seen in FIG. 1) has a source 32 and a drain 33 formed within the p-type well 31 (PWI). A p-type contact 34 is formed by diffusion in the surface of the p-type well 31. Also, a p-type contact 35 is formed in the surface of the substrate 20, preferably adjacent to the second deep n-type well 22. A gate 36 is formed over an insulator (not shown) over the channel region between the source 32 and a drain 33 of the NMOS transistor 14. The gate 36 is coupled to the contact 34, so that the gate of the NMOS transistor 14 is coupled to the semiconductor bulk in which the channel of the NMOS transistor 14 is formed. The source 32 of the NMOS transistor 14 is coupled to the terminal 35 and to a ground reference. The drain 33 of the NMOS transistor 14 is coupled to the node 30. A contact 37 is formed in the surface of the second deep n-type well 22. The contact 37 is coupled to the highest voltage VPCP11 generated on that chip during operation, or to another voltage level sufficient to maintain isolation of the p-type well 31. The gate 36 of the NMOS transistor 14 is coupled to a circuit which supplies the lowest voltage NVPP provided on the chip, at least as low as the lowest voltage applied at the node 30 during operation, or to a circuit which provides a voltage low enough to turn off the NMOS transistor 14 during operation of the circuitry. During manufacturing, the gate 36 is left floating.

The gate insulator between the gate and channel of the NMOS transistor 14 and of the PMOS transistor 12 should be strong enough to withstand the high or low voltages applied during operation of the device. For example, the gate insulator comprises a relatively thick oxide, compared to gate oxide thicknesses for logic transistors, in one embodiment of the device.

As mentioned before, the protection device of U.S. patent application Ser. No. 20040007730 provides protection per word line. During positive charging, the PMOS transistor 12 turns on and clamps the high voltage. During negative charging, the NMOS transistor 14 turns on and clamps the high voltage. During product operation, the bipolar transistors PMOS and NMOS transistors 12 and 14 are turned off, due to voltages applied to the terminals VPCP11 and NVPP. For correct operation as a fuse one needs short channel devices (high β of the bipolar transistors). Careful optimization should be done on the Ld parameter, to provide the best tradeoff between efficient clamping and leakage at the off state.

Reference is now made to FIG. 2. In order to implement the above prior art structure per word line, a dedicated connectivity for each word line to each dedicated transistor is required. The area penalty is substantial, and may range between 2-20%, pending on various factors, e.g., the physical sector size (number and length of word lines) and design rules.

SUMMARY OF THE INVENTION

There is provided, in accordance with an embodiment of the present invention a method for protecting NROM devices from charge damage during process steps, the method including providing X-decoder structure for word line connections, wherein each word line is connected to a pair of transistors, a PMOS transistor T1 and an NMOS transistor T4, the PMOS transistors T1 sharing a common deep N well and the NMOS transistors T4 associated with a P well, wherein during positive charging, the PMOS transistors T1 shunt leakage current to ground, and during negative charging, the NMOS transistors T4 shunt leakage current to ground, providing an N+ tap connected to the N well and connecting the N+ tap to a positive voltage clamping device, and connecting all the P wells together to a common P+ tap and connecting the P+ tap to a negative voltage clamping device, wherein during process steps, the positive and negative voltage clamping devices direct leakage current (for example, from the PMOS and NMOS transistors T1 and T4, respectively) to ground.

In accordance with an embodiment of the present invention, the positive voltage clamping device includes a PMOS transistor T2, and the negative voltage clamping device includes a NMOS transistor T5.

Further in accordance with an embodiment of the present invention, the voltage clamping devices and method include providing antenna structure and at least one access transistor for protection during top-level metal formation. The antenna structure may include a dummy word line connected to a word line driver. The at least one access transistor may be a PMOS transistor T3 for positive charging clamping structure wherein, the at least one access transistor may be an NMOS transistor T6 for negative charging clamping device. All the P wells may be connected together with a first metal layer or a poly layer or be a common P well.

BRIEF DESCRIPTION OF THE DRAWINGS

The present invention will be understood and appreciated more fully from the following detailed description taken in conjunction with the drawings in which.

DETAILED DESCRIPTION OF EMBODIMENTS

Figure 1:
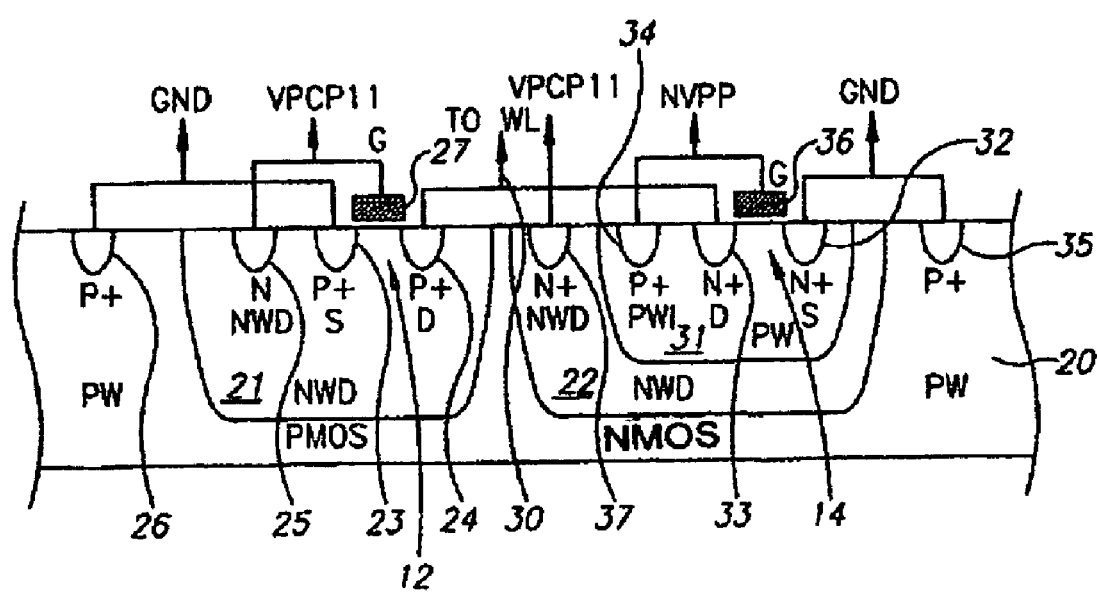
FIG. 1 is a simplified diagram of prior art transistor circuitry for protecting memory cells from damage induced during device fabrication protection.
Figure 2:
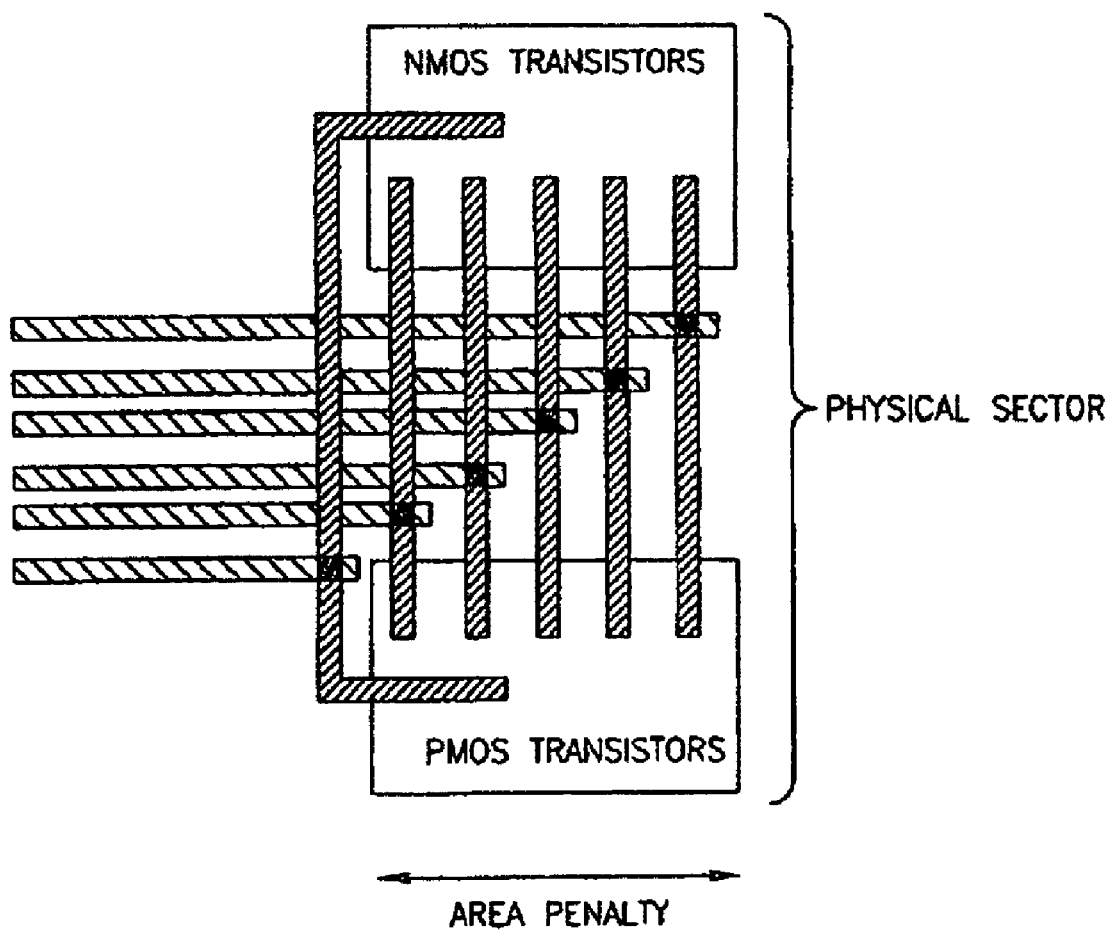
FIG. 2 is a simplified diagram of a physical sector of the prior art showing the relatively large area needed to implement the prior art solution of two bipolar transistors for each word line.
Figure 3:
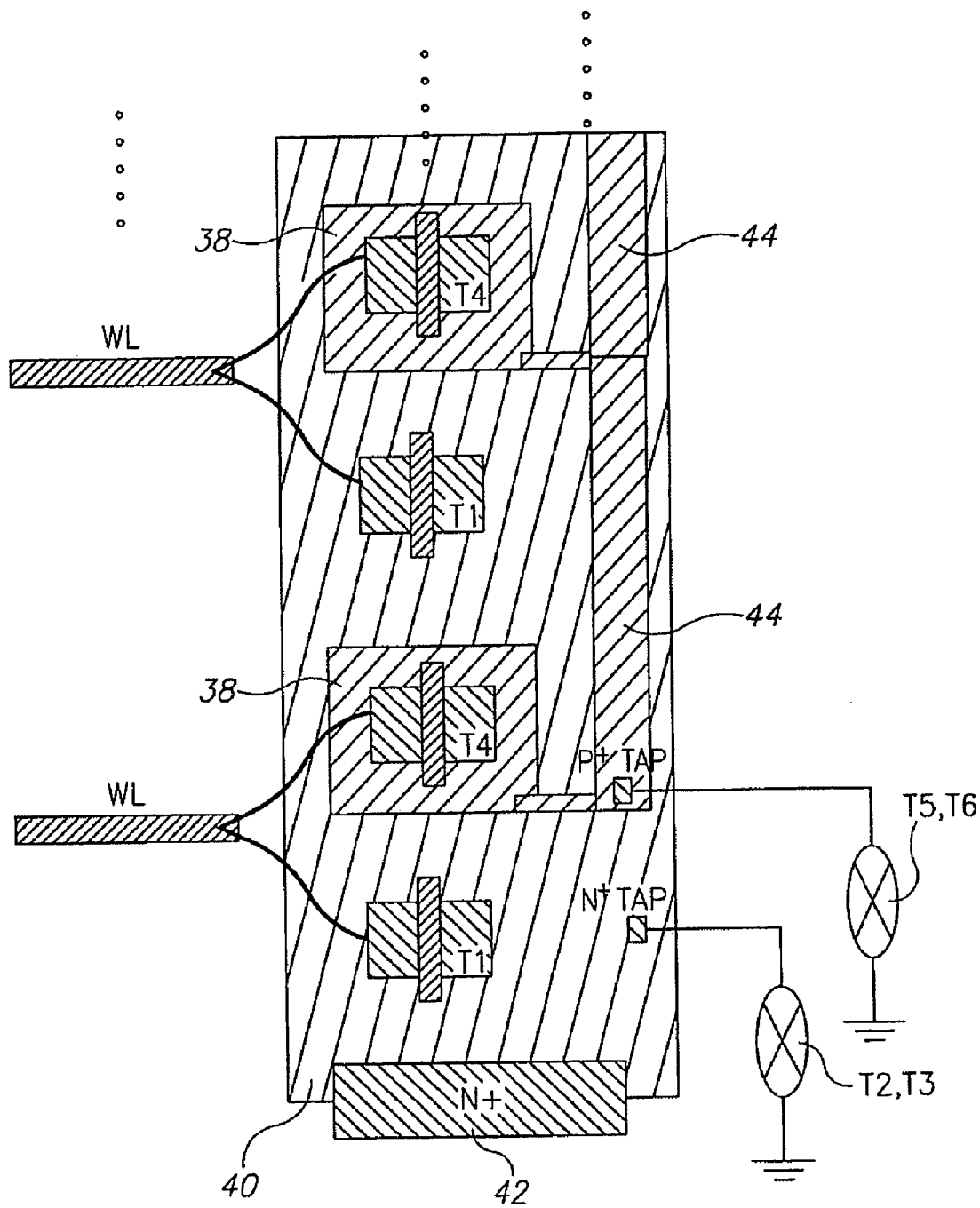
FIG. 3 is a simplified diagram of circuitry for protecting memory cells from damage induced during device fabrication protection, constructed and operative in accordance with an embodiment of the present invention, the circuitry providing global protection for all word lines.

Reference is now made to FIG. 3, which illustrates circuitry for protecting memory cells from damage induced during device fabrication protection, constructed and operative in accordance with an embodiment of the present invention. Unlike the prior art, this circuitry provides global protection for all word lines and saves significant die area.

The circuitry shown includes word lines connected to an X-decoder, which serves as the word line driver. Part of the X-decoder region (word line driver) is shown in FIG. 3 comprising pairs of transistors—PMOS transistors T1 (which serve as back-to-back diodes when combined with additional N+ region overlapping the NWELL region) and NMOS transistors T4. The PMOS transistors T1 are fabricated on a common deep N well 40. The NMOS transistors T42 are fabricated on P well tabs 38. The word lines are connected to the drains (active regions) of T1 and T4. A plurality of word line drivers share the deep N well 40 which has an addition of an n+ active region 42. The circuitry described so far is back-to-back diode protection circuitry that exists in the art.

The present invention utilizes the above-mentioned X-decoder circuitry and adds global protection circuitry for all word lines. In accordance with an embodiment of the present invention, this may be accomplished by providing an N+ tap for the common N well of the PMOS transistors T1 and connecting the N+ tap to a positive voltage clamping device, (for example PMOS transistors T2 and T3 shown in FIG. 5) external to the X-decoder structure. Connections may be done using poly interconnect or first metal only. The P well tabs 38 of all the NMOS T4 transistors may be connected together with either P well connections 44 or with a first metal layer or poly, and a P+ tap common to the P wells may be connected to a negative voltage clamping device, (for example, a NMOS transistors T5 and T6 shown in FIG. 4) external to the X-decoder protection structure.

Thus, the word lines to the N+/P+ active regions contact in the X-decoder region are globally connected to negative and positive voltage clamping devices) to provide negative and positive protection, respectively. During the process steps, the negative and positive voltage clamping devices may be used as fuses that direct the leakage from the NMOS and PMOS transistors T4 and T1, respectively, to the substrate. During normal operation of the product, applied voltages block this leakage path. Preferably, although not mandatory, connectivity should be realized using low level metal in order to provide protection for the process steps that follow.

Figure 4:
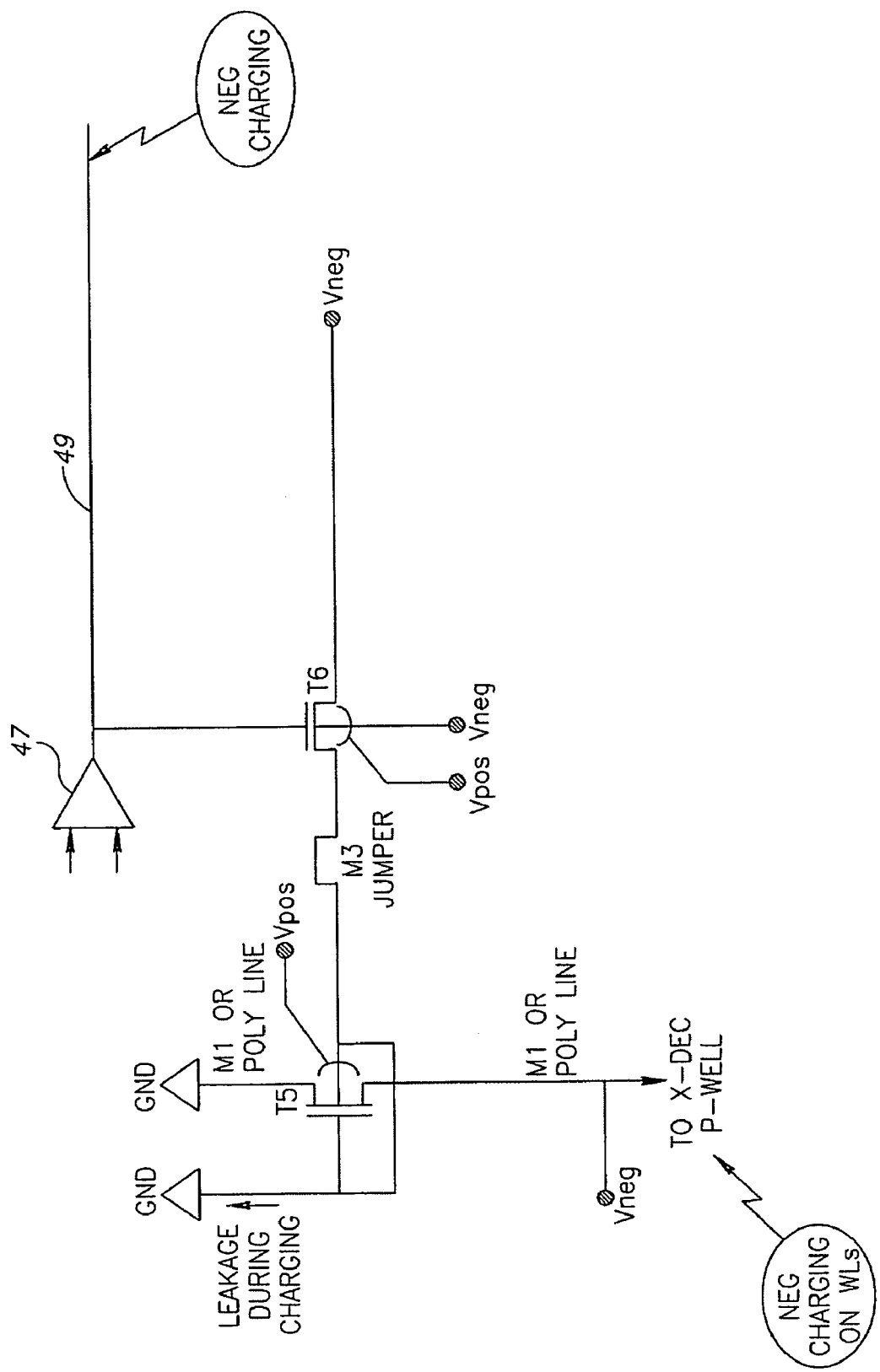
FIG. 4 is a simplified circuit schematic of the protection circuitry of FIG. 3, showing the negative charging protection circuitry.

Reference is now made to FIG. 4, which is a simplified circuit schematic of the NMOS protection circuitry of FIG. 3, showing the negative charging protection circuitry. At the left of the circuit diagram can be seen NMOS transistor T5 with its source connected to ground, its gate connected to its bulk, and its drain connected to the X-decoder P well. At the right of the circuit diagram can be seen an NMOS transistor T6 with its source connected to an input Vneg, its gate connected to a dummy word line 49 associated with word line driver 47, and its drain connected via a jumper M3 (highest metal level available) to the bulks and gate of NMOS transistor T5. There is a purposely disconnected line between T5 and T6, so that during fabrication transistor T6 does not come into play and the discharge path via T5 is not blocked. The highest metal level is used to connect this purposely disconnected line between T5 and T6 in order to allow access of voltage bias during operation mode to block the discharging path via T5. The word line driver associated with the dummy word line may be used to input a positive bias voltage in operation mode. If negative charging occurs during the manufacturing process, NMOS transistor T6 is off as the dummy WL is as well negatively charged, which means that the discharging path via NMOS transistors T5 is not blocked. Conversely, NMOS transistor T6 is on during operation, which means that the discharging path to ground via NMOS transistors T5 is blocked.

Figure 5:
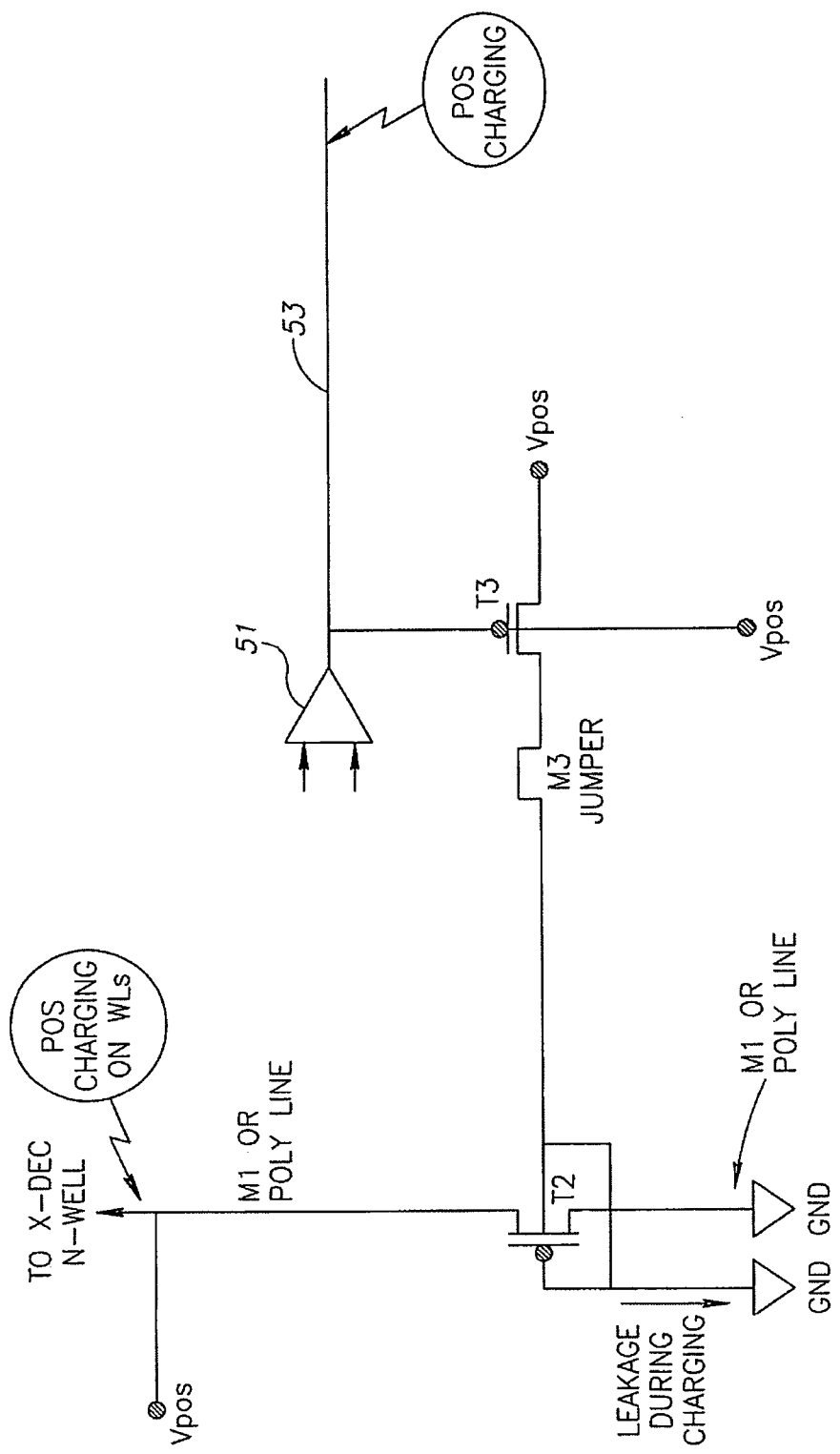
FIG. 5 is a simplified circuit schematic of the protection circuitry of FIG. 3, showing the positive charging protection circuitry.

The connectivity to the core protection structure should preferably be formed in the highest metal layer since the discharging transistor T5 should be isolated from any other structures during the manufacturing process to assure that during negative charging the discharging path is open. However, during operation mode, negative voltages may be applied to the word lines, thus an access to T5 should be formed to allow blocking the discharging path via T5. To allow this, as mentioned before, the highest metal jumper is formed. However, forming this jumper may result in unintentional charging via transistor T6 that may block transistor T5 during the manufacturing steps that follow. To overcome this concern, the dummy word line is connected to the word line driver and serves as antenna structure for protection from charging via transistor T6 and the highest metal level jumper. Reference is now made to FIG. 5, which is a simplified circuit schematic of the protection circuitry of FIG. 3, showing the positive charging protection circuitry. At the left of the circuit diagram can be seen PMOS transistor T2 with its source connected to ground, its gate connected to its bulk, and its drain connected to the X-decoder N well. At the right of the circuit diagram can be seen a PMOS transistor T3 with its drain connected to an input Vpos, its gate connected to a word line driver 51 on a dummy word line 53, and its source connected via a jumper M3 to the bulks and gates of PMOS transistor T2. The word line driver associated with the dummy word line may be used to input a negative bias voltage to allow blocking the discharge path via T2 during operation mode. If positive charging occurs during the manufacturing process, PMOS transistor T3 is off as the dummy WL is as well positively charged, which means that any leakage is shunted to ground via PMOS transistors T2. Conversely, PMOS transistor T3 is on during operation, which means that the discharge path via PMOS transistors T2 is blocked.

Here also, the dummy word line connected to the word line driver serves as antenna structure for charging protection for the access path used in the highest metal level. The connectivity to the core protection structure should preferably be formed in the highest metal layer.

It is also appreciated that various features of the invention which are, for clarity, described in the contexts of separate embodiments, may also be provided in combination in a single embodiment. Conversely, various features of the invention which are, for brevity, described in the context of a single embodiment, may also be provided separately or in any suitable subcombination.

What is claimed is:

1. A method for protecting NROM devices from charge damage during process steps, the method comprising: providing X-decoder structure for word line connections, wherein each word line is connected to a pair of transistors, a PMOS transistor (T1) and an NMOS transistor (T4), the PMOS transistors (T1) sharing a common deep N well and the NMOS transistors (T4) connected to a P well, providing an N+ tap connected to said N well and connecting the N+ tap to a positive voltage clamping device; and connecting all the P wells together to a common P+ taps, connecting the P+ tap to a negative voltage clamping device; wherein during process steps, the negative and positive voltage clamping devices direct leakage current to a ground potential: providing antenna structure and at least one access transistor for protection during top-level metal formation, and wherein said antenna structure comprises a dummy word line connected to a word line driver.

2. The method according to claim 1, wherein said negative voltage clamping device comprises a NMOS transistor (T5).

3. The method according to claim 1, wherein said positive voltage clamping device comprises a PMOS transistor (T2).

4. The method according to claim 1, further comprising providing at least one access transistor for access of voltage bias to the clamping devices during operation mode.

5. The method according to claim 1, wherein for negative charging protection structure comprising NMOS transistors (T4) and (T5), the at least one access transistor is an NMOS transistor (T6).

6. The method according to claim 1, wherein for positive charging protection structure comprising PMOS transistors (T1) and (T2), the at least one access transistor is a PMOS transistor (T3).

7. The method according to claim 1, wherein all the P wells are connected together with a first metal layer.

8. The method according to claim 1, wherein all the P wells are connected together with a poly layer.

9. The method according to claim 1, wherein the P well is a common P well.

10. Circuitry for protecting NROM devices from charge damage during process steps, the circuitry being used with existing X-decoder structure for word line connections, wherein each word line is connected to a pair of transistors, an PMOS transistor (T1) and a NMOS transistor (T4), the PMOS transistors (T1) sharing a common deep N well and the NMOS transistors (T4) each connected to a P well, the circuitry comprising: an N+ tap connected to said N well and to a positive voltage clamping device, a common P+ tap that connects all the P wells together, the common P+ tap being connected to a negative voltage clamping device, wherein during process steps, the negative and positive voltage clamping devices direct leakage current to ground potential; providing antenna structure and at least one access transistor for protection during top-level metal formation, and wherein said antenna structure comprises a dummy word line connected to a word line driver.

11. The circuitry according to claim 10, wherein said negative voltage clamping device comprises an NMOS transistor (T5).

12. The method circuitry according to claim 10, wherein said positive voltage clamping device comprises a PMOS transistor (T2).

13. The method circuitry according to claim 10, further comprising providing at least one access transistor for access of voltage bias to the clamping devices during operation mode.

* * * * *